(12) United States Patent
Toporski et al.

(10) Patent No.: US 7,272,189 B2
(45) Date of Patent: Sep. 18, 2007

(54) METHOD TO DETERMINE THE PRESENCE OF MULTI-CARRIER SIGNALS

(75) Inventors: Todd Allen Toporski, Northville, MI (US); J. William Whikehart, Novi, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 753 days.

(21) Appl. No.: 10/682,952

(22) Filed: Oct. 11, 2003

(65) Prior Publication Data

US 2005/0077889 A1    Apr. 14, 2005

(51) Int. Cl.
*H04K 1/10* (2006.01)
(52) U.S. Cl. ..................................... 375/260
(58) Field of Classification Search ............... 375/142, 375/150, 260, 343; 324/76.19
See application file for complete search history.

(56) References Cited

U.S. PATENT DOCUMENTS

| | | | |
|---|---|---|---|
| 5,272,446 A * | 12/1993 | Chalmers et al. ........... 375/324 |
| 5,465,396 A | 11/1995 | Hunsinger et al. |
| 5,757,854 A | 5/1998 | Hunsinger et al. |
| 5,850,415 A | 12/1998 | Hunsinger et al. |
| 5,867,479 A * | 2/1999 | Butash ....................... 370/210 |
| 5,949,796 A | 9/1999 | Kumar |
| 6,005,894 A | 12/1999 | Kumar |
| 6,246,698 B1 | 6/2001 | Kumar |
| 6,295,317 B1 | 9/2001 | Hartup et al. |
| 6,351,500 B2 | 2/2002 | Kumar |
| 6,353,637 B1 | 3/2002 | Mansour et al. |
| 6,430,724 B1 | 8/2002 | Laneman et al. |
| 6,445,693 B1 | 9/2002 | Saraaf et al. |
| 6,480,536 B2 | 11/2002 | Hartup et al. |
| 6,487,252 B1 * | 11/2002 | Kleider et al. .............. 375/260 |
| 6,510,175 B1 | 1/2003 | Hunsinger et al. |
| 6,662,367 B2 * | 12/2003 | Dapper et al. .............. 375/346 |
| 7,095,781 B1 * | 8/2006 | Hsu et al. ................... 375/224 |
| 7,170,944 B1 * | 1/2007 | Liu et al. .................... 375/260 |
| 2001/0024475 A1 | 9/2001 | Kumar |
| 2001/0050926 A1 | 12/2001 | Kumar |
| 2002/0097796 A1 | 7/2002 | Hartup et al. |
| 2002/0106987 A1 | 8/2002 | Linden |
| 2002/0172270 A1 | 11/2002 | Whikehart et al. |
| 2003/0009765 A1 | 1/2003 | Linden et al. |
| 2003/0198304 A1 * | 10/2003 | Sugar et al. ................ 375/340 |
| 2004/0052304 A1 * | 3/2004 | Reial .......................... 375/148 |
| 2004/0132443 A1 * | 7/2004 | Klein et al. ................. 455/424 |
| 2004/0139466 A1 * | 7/2004 | Sharma et al. ............... 725/72 |
| 2004/0146125 A1 * | 7/2004 | Shiung et al. ............... 375/334 |
| 2004/0203405 A1 * | 10/2004 | Reial et al. ................... 455/65 |
| 2004/0252776 A1 * | 12/2004 | Balakrishnan et al. ...... 375/260 |
| 2007/0041431 A1 * | 2/2007 | Reial .......................... 375/147 |
| 2007/0041432 A1 * | 2/2007 | Reial .......................... 375/148 |

* cited by examiner

*Primary Examiner*—David C. Payne
*Assistant Examiner*—Aslan Ettehadieh
(74) *Attorney, Agent, or Firm*—Brinks Hofer Gilson & Lione

(57) ABSTRACT

A method for determining the presence of multiple carrier frequency components in an electrical signal by calculating a value for at least one characteristic of the set of peaks in a defined portion of the frequency spectrum, such as the number of peaks within a defined portion of the frequency spectrum or the average spacing between pairs of peaks, and defining a range of values of the characteristic that would indicate the presence of multiple carrier components, and comparing this calculated characteristic value against the values in the defined range of values.

13 Claims, 3 Drawing Sheets

METHOD TO DETERMINE THE PRESENCE OF MULTI-CARRIER SIGNALS

BACKGROUND OF THE INVENTION

The present invention relates generally to the field of radio communications systems, and more specifically to an inventive method to quickly determine the presence of a multi-carrier signal on a received channel using spectral characteristics of the received signal.

Multiple carriers are used in the transmission of digital signals to maximize correct reception of those signals in the presence of noise and interference and to maximize the data capacity of the transmission channel. An example of a multiple-carrier system is an orthogonal frequency division multiplexing (OFDM) system, which is used in both cellular telephone systems and in digital radio systems such as AM/FM in-band on-channel (IBOC) systems. Today's broadcast radio systems is comprised of channels that may contain multiple-carrier signals, such as IBOC channels, as well as the traditional analog channels that do not transmit multiple carrier signals, such as AM/FM channels.

Fast detection or determination of the presence of the multiple-carrier is needed to allow the receiver or the receiver's user to determine whether to continue to receive a channel if the multiple carriers are not present. For example, in an IBOC radio receiver, a particular tuned channel may be transmitting either traditional analog signals (i.e., non-IBOC signals) in which no multiple carriers present or IBOC signals in which multiple carriers are present. The user may prefer to listen only to IBOC channels and so not to continue receiving a channel if it does not transmit IBOC signals.

Before a digital audio receiver can recover the digital content of a multiple-carrier signal, the receiver must typically "lock" onto the digital signal. "Locking" means that the receiver adaptively configures itself through time, phase, and/or amplitude alignment mechanisms, such as by means of a phase-lock-loop, to receive the multiple-carrier signal in such a way that the digital content of the signal can be recovered. Receivers designed to receive complex digital modulation signals, such as IBOC signals, typically require a significant amount of time to lock onto the multiple carrier signal once the receiver is tuned to a channel where an IBOC signal is present.

The locking event or the lack of locking can be used as an indicator of the presence of the multiple-carrier signal. However, the long time period that is required for locking to occur, or to determine that no locking has taken place, conflicts with the general requirement for fast detection. Therefore, a different method that quickly detects or determines the presence of multiple-carrier signal components is needed.

SUMMARY OF THE INVENTION

The present invention describes a method for determining the presence of multiple carrier frequency components in an electrical signal by calculating a value for at least one characteristic of the set of peaks in a defined portion of the frequency spectrum, defining a range of values of the characteristic that would indicate the presence of multiple carrier components, and comparing this calculated characteristic value against the values in the defined range of values. Examples of the type of characteristics of the peaks that may be used include the number of peaks within a defined portion of the frequency spectrum and the average spacing between pairs of peaks. These and other aspects and advantages of the present invention will become apparent upon reading the following detailed description of the invention in combination with the accompanying drawings.

DETAILED DESCRIPTION OF THE INVENTION

The following description of the preferred embodiment of the inventive detection method is not intended to limit the inventive method to this preferred embodiment, but rather to enable any person skilled in the art of radio communications systems to make and use the inventive method.

Figure 1:
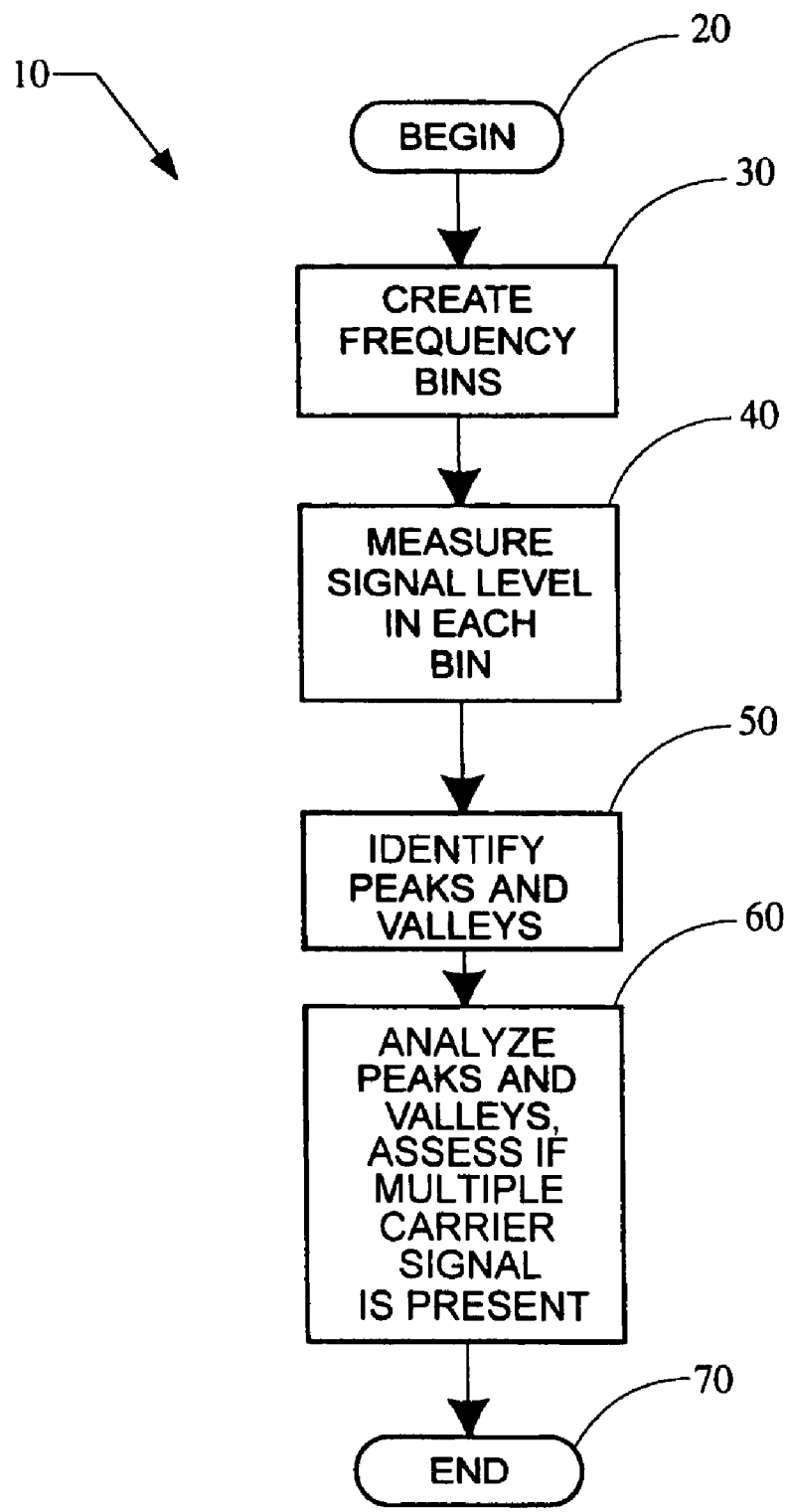
FIG. 1 is a flowchart depicting the steps of the inventive fast detection method.

Referring now to FIG. 1, the inventive detection method 10 begins at starting point 20. In step 30, frequency bins are created by characterizing spectrally the portion of the spectrum of the received signal that contains the multiple-carrier signal, or some smaller part of that portion, using a spectral resolution that is finer than the frequency spacing of the multiple carriers. This characterization may be performed using any one of many techniques generally known in the art of communication systems, such as, by way of example and not limitation, by Fast Fourier Transform or by a poly-phase filter bank.

In step 40, the signal level in each bin is measured using any one of many techniques generally known in the art of communication systems, such as, by way of example and not limitation, an energy or power level detector at each frequency. If the signal being analyzed contains multiple carriers, the characterization of the signal will exhibit a pattern of peaks and valleys. The peaks will be located at the frequencies at or near the location of the multiple carriers, and valleys will be located between these peaks.

In step 50, a means of identifying the peaks and valleys is employed. One method to determine the location of peaks and valleys is the "local maximum" method (although an analogous "local minimum" method could also be employed). In the local maximum method, a presumed peak is considered a peak if the frequency characteristic drops on either side of the presumed peak by at least a certain amount, regardless of whether or not the drop is the same on both sides.

One benefit of the local maximum approach is that it removes the effect of variations in the levels of the individual sub-carrier components due to filtering in the receiver and/or frequency-selective fading on the incoming signal. For example, in the local maximum method, a valley is considered a valley if the frequency characteristic rises on either side of a presumed valley by at least a certain amount, regardless of whether or not the rise is the same on both sides. Although the local maximum method may be used in the preferred embodiment of the inventive method shown in FIG. 1, any one of many other methods of estimating the location of a local maximum known to those skilled in the art of communications systems could also be used.

The set of measured levels in the bins resulting from step 40 may exhibit fast variations due to noise that may be present in the signal. This noise may lower the accuracy of identifying the peaks and valleys in identification step 50. However, this noise may be reduced prior to step 50 by applying a low pass filter to the set of bin levels. The bandwidth of the low pass filter should be set such that the expected patterns of peaks and valleys will pass through the filter but the noise will not.

In step 60, the pattern of peaks and valleys is analyzed and evaluated to determine whether a multi-carrier signal is present before the process terminates in step 70.

Figure 2:
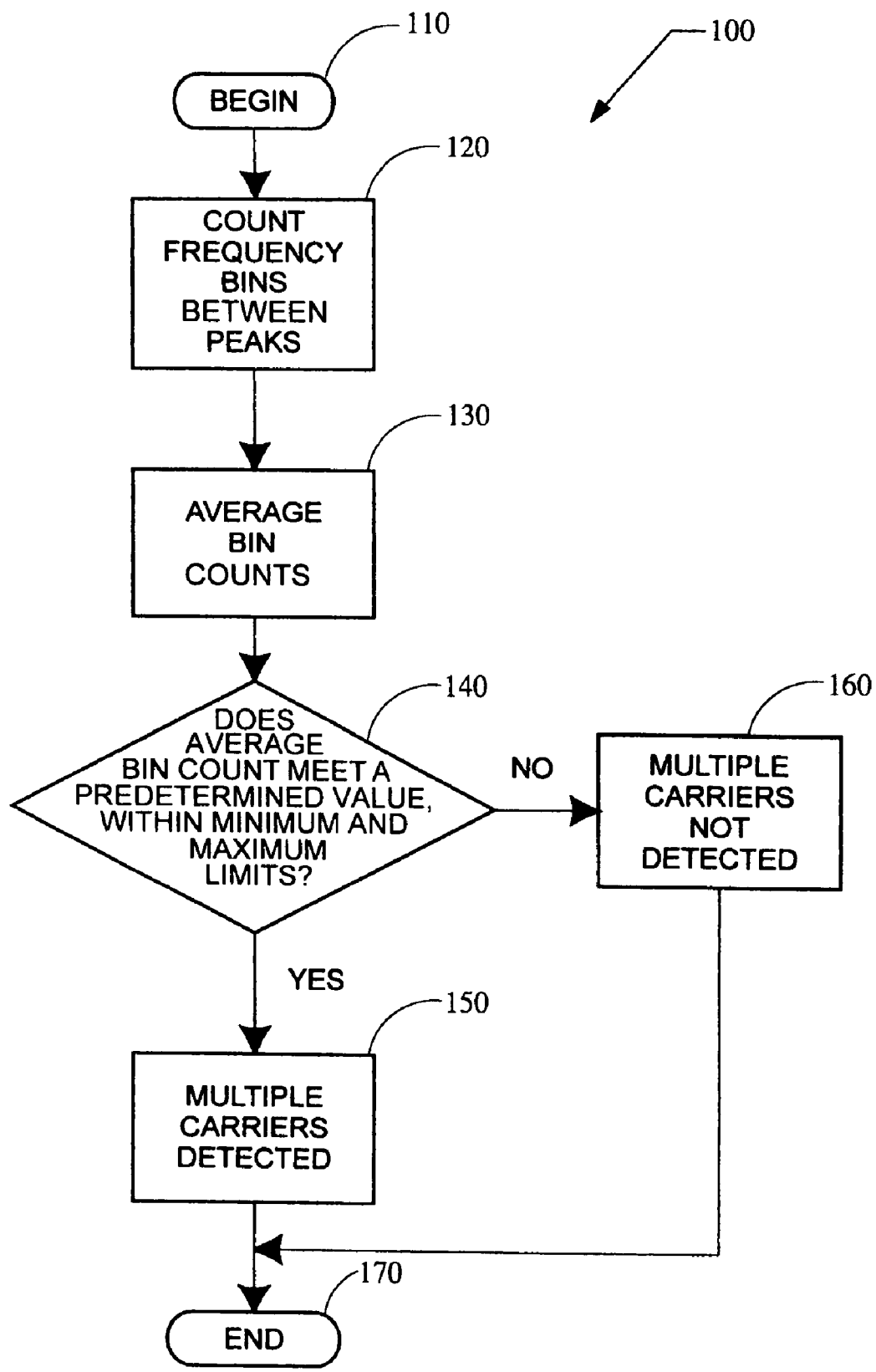
FIG. 2 is a flowchart depicting the steps of the inventive fast detection method using values for peak counts.

Referring now to FIG. 2, a method suitable for performing the analysis and assessment of step 60 is described in greater detail. The method begins in step 110 then proceeds to step 120 in which the number of frequency bins, indicative of the spacing between the peaks, is counted. In step 130 an average value for the number of frequency bins between peaks is computed. This computed average value is determined using at least two pairs of adjacent peaks.

In step 140, the computed average value is compared to a predetermined range of values for the number of frequency bins between peaks or the spacing. If the computed average value falls within the predetermined range then a multiple-carrier signal component is detected in step 150 before the process ends in step 170. If the computed average value falls outside of the predetermined range then no multiple-carrier signal component is detected before the process ends in step 170.

A standard deviation approach could also be employed to measure the reliability of the computed average value determined in step 130. A large standard deviation may mean that the computed average value is not a reliable number. The uncertainty or standard deviation of the counts obtained in step 120 can also be used as part of an alternative higher-level strategy to determine the uncertainty of the process outline in FIG. 2 as to whether the pattern of peaks and valleys indicative of a multiple-carrier signal is present or not. For example, if the uncertainty is higher than a certain threshold, the determination result may be that the multiple carrier signal may be present but noisy, and should be rechecked at a later time.

Figure 3:
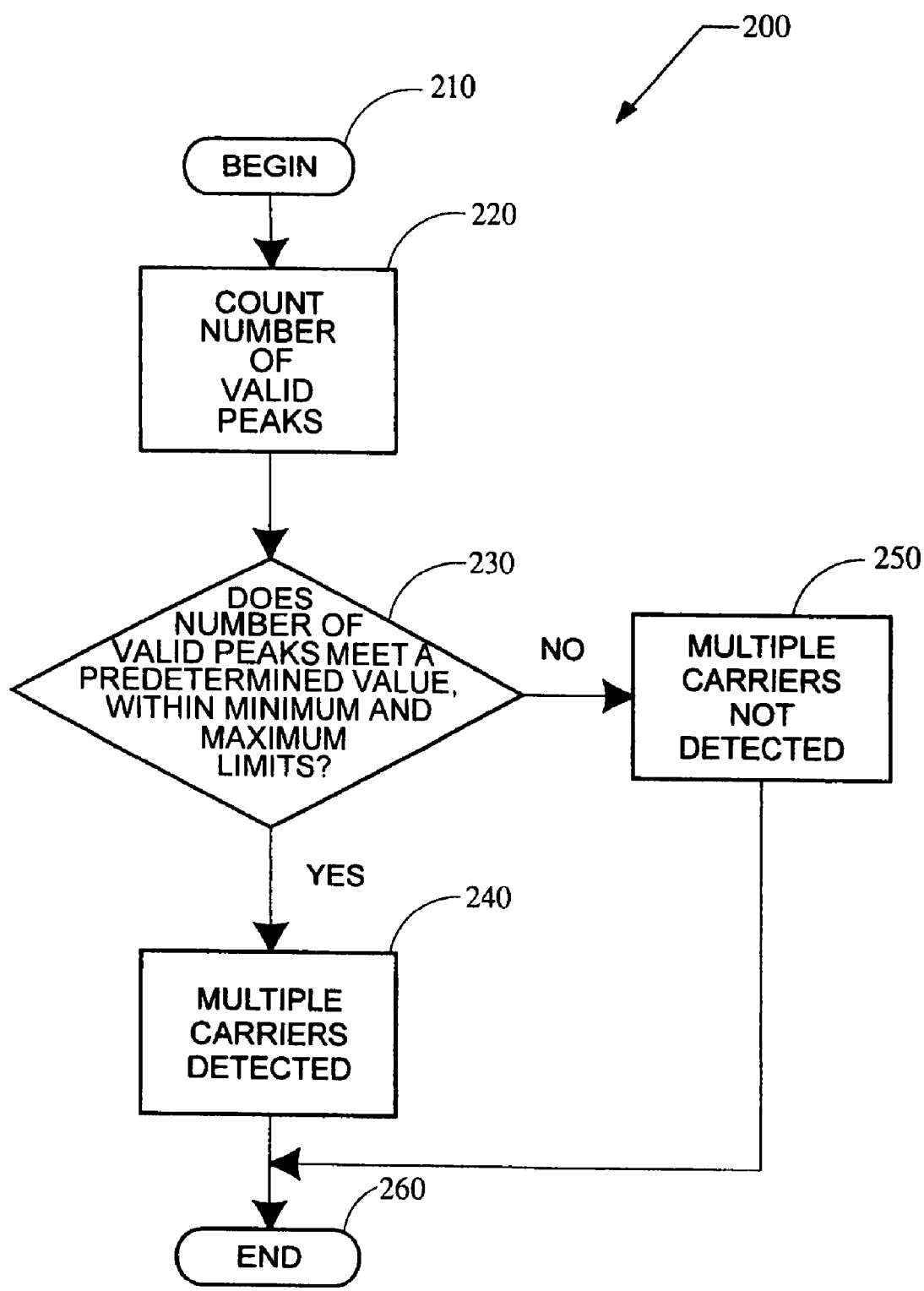
FIG. 3 is a flowchart depicting the steps of the inventive fast detection method using average values for the spacing between pairs of peaks.

Referring now to FIG. 3, a second method suitable for performing the analysis and assessment of step 60 is described in greater detail. This method begins in step 210 then proceeds to step 220 in which the valid peaks are counted within the portion of the frequency spectrum. In step 230, the number of valid peaks counted in step 220 is compared to a predetermined range of values for the number of valid peaks. If the counted number of valid peaks falls within the predetermined range of values, then a multiple-carrier signal component is detected in step 240 before the process ends in step 270. If the counted number of valid peaks falls outside of the predetermined range of values for the number of valid peaks, then no multiple-carrier signal component is detected before the process ends in step 270.

Under some reception conditions, a portion of the signal spectrum containing the multiple carriers may be impaired by noise and/or interference. In this case, the detection methods outlined above may be applied to smaller parts of the spectrum to detect the multiple carriers but avoid any impairment. For example, in the case of IBOC signals, the spectrum containing the multiple carriers is split between the upper and lower sidebands around the carrier or portions thereof. The detection technique outlined above could be applied to the upper and lower spectrums separately.

The multiple-carrier spectrum could also be subdivided evenly or unevenly into frequency bands, with the detection methods outlined above applied separately to each band. In each of the approaches outlined above, detection of a multiple carrier signal may be performed by combining the detection results from the individual frequency bands using any one of the various methods for combining detection results that are generally known in the art. One such method would be to require that the multiple carrier signal be detected in a certain minimum number of the subdivided frequency bands.

One advantage of the inventive methods outline above is that the same processing resources in the receiver that are normally used to fully demodulate the multiple-carrier signal for recovery of its digital content may be used to implement the present inventive fast detection method for multiple carrier component signals. For example, the demodulation processing resources could be configured by a controller to perform the above outlined methods prior to demodulation. If the multiple-carrier component signal is detected, the controller could then re-configure these same processing resources to carry out the locking and demodulation functions. Thus, additional processing resources for the present inventive fast detection method and the associated additional system cost could be avoided.

The present inventive fast detection method for multiple carrier signal components is not limited to the embodiments illustrated and described; it also covers all equivalent implementations of this method insofar as they do not depart form the spirit of the inventive method. Further, the inventive method is not yet limited to the combination of features as described herein but may be defined by any other combination of all of the individual features disclosed. Any person skilled in the art of radio communications systems will recognize from the previous detailed description and from the figures and claims that modifications could be made to the preferred embodiments of the inventive method without departing from the scope of the inventive method, which is defined by the following claims.

We claim:

1. A method for determining in a radio communications system a presence of multiple carrier frequency components in an electrical signal having at least one set of peaks in a defined portion of the frequency spectrum, comprising steps of:

receiving an electrical signal having multiple carrier frequency components;

creating frequency bins through spectral characterization of at least a portion of the frequency spectrum containing the multiple carrier frequency components, wherein resolution of said spectral characterization is finer than said portion of the frequency spectrum containing said multiple carrier frequency components, determining a set of peaks by measuring signal level in at least three of said frequency bins;

calculating a value for at least one characteristic of said set of peaks based on results of said measuring of signal level;

defining a range of values of the characteristic that indicates said presence of multiple carrier components;

comparing the calculated characteristic value against the values in the defined range of values;

determining that said multiple carrier frequency components are present when said calculated value falls within said defined range of values;

terminating reception in said radio communications system of said electrical signal when said calculated value does not fall within said defined range of values.

2. The method of claim 1, wherein said spectral characterization is performed by a fast Fourier transform method.

3. The method of claim 1, wherein said spectral characterization is performed using a poly-phase filter bank.

4. The method of claim 1, wherein said signal level is the energy level.

5. The method of claim 1, wherein said signal level is the power level.

6. The method of claim 1, wherein determining said set of peaks is performed using a local maxima.

7. The method of claim 1, wherein determining said set of peaks is performed using a local minima.

8. The method of claim 1, further comprising a step of:
computing the reliability of determining said set of peaks using the standard deviation of the characteristic.

9. The method of claim 1, wherein resolution used in the spectral characterization is reduced in the presence of noise.

10. The method of claim 1, wherein said portion of the frequency spectrum containing the multiple carrier frequency components is divided into even sub-portions.

11. The method of claim 1, wherein the portion of the frequency spectrum containing the multiple carrier frequency components is divided into uneven sub-portions.

12. The method of claim 10, further comprising the step of:
determining multiple carrier frequency components to be present in said portion of said frequency spectrum if multiple carrier frequency components are determined to be present in a predefined number of said even sub-portions of said frequency spectrum.

13. The method of claim 11, further comprising the step of:
determining multiple carrier frequency components to be present in said portion of said frequency spectrum if multiple carrier frequency components are determined to be present in a predefined number of said uneven sub-portions of said frequency spectrum.

* * * * *